United States Patent
Gupta et al.

(10) Patent No.: US 6,383,858 B1
(45) Date of Patent: May 7, 2002

(54) INTERDIGITATED CAPACITOR STRUCTURE FOR USE IN AN INTEGRATED CIRCUIT

(75) Inventors: Rohini Gupta, Bedminster, NJ (US); John D. Tauke, Bath, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/505,762

(22) Filed: Feb. 16, 2000

(51) Int. Cl.$^7$ .......................................... H01L 21/8242
(52) U.S. Cl. ...................... 438/238; 438/253; 438/381
(58) Field of Search .................. 438/238, 250–256, 438/331, 393–399

(56) References Cited

U.S. PATENT DOCUMENTS

| | | | | |
|---|---|---|---|---|
| 5,208,725 A | * | 5/1993 | Akcasu | 361/313 |
| 5,763,911 A | * | 6/1998 | Matthews et al. | 257/301 |
| 5,798,559 A | * | 8/1998 | Bothra et al. | 257/522 |
| 5,939,766 A | * | 8/1999 | Stolmeijer et al. | 257/534 |
| 6,030,896 A | * | 2/2000 | Brown | 438/687 |

\* cited by examiner

*Primary Examiner*—Jey Tsai

(57) ABSTRACT

The present invention provides a capacitor structure comprising an array having two dimensions and having first and second electrode elements alternating in both dimensions of the array, the first electrode elements interconnected and the second electrode elements interconnected, to cause the array to function as a capacitor. The capacitor structure further comprises a dielectric material, which in one embodiment may be silicon dioxide ($SiO_2$), separating the first and second electrode elements in both of the dimensions. In one embodiment of the invention, the first electrode elements are interconnected by a first interconnect, and the second electrode elements are interconnected by a second interconnect, allowing the first and second electrode elements to function as an interdigitated capacitor.

9 Claims, 6 Drawing Sheets

INTERDIGITATED CAPACITOR STRUCTURE FOR USE IN AN INTEGRATED CIRCUIT

TECHNICAL FIELD OF THE INVENTION

The present invention is directed, in general, to a capacitor for use in an integrated circuit and, more specifically, to a capacitor having interdigitated electrode elements that can be used in an integrated circuit and a method of manufacture therefore.

BACKGROUND OF THE INVENTION

Passive components such as capacitors are extensively used in integrated circuit (IC) design for radio-frequency (RF) and mixed-signal applications, such as bypassing, interstage coupling, and in resonant circuits and filters. Due to the trends toward higher-levels of integration to achieve reduction in cost associated with IC fabrication processes, the integrated IC industry continually strives to economize each step of the IC fabrication process to the greatest extent possible, while maintaining the highest degree of quality and functionality as possible.

One semiconductor device, which has found extensive application in ICs, is the capacitor. The IC industry has devised various types of capacitors for use in both complementary metal oxide semiconductor (CMOS) and Bipolar CMOS devices. Two types of capacitors that the IC industry has developed are metal on metal (MOM) and poly on poly (POP) capacitors. With these devices, the IC industry is able to attain very precise capacitance values in analog circuits. A benefit of MOM and POP capacitors is that they are able to achieve a high capacitance value for a small area. MOM capacitors are commonly formed on a silicon substrate by depositing a first metal layer of titanium (Ti), followed by the deposition of a titanium nitride (TiN) layer, which serves as one of the capacitor's electrodes. A capacitor dielectric material is then deposited over the TiN. Following the deposition of the capacitor dielectric layer, a metal, which serves as the other capacitor's electrode, is deposited over the dielectric layer. The various layer are then patterned and etched to form the desired capacitor structure. Often these MOM and POP capacitors will be formed within an opening in a dielectric material.

POP capacitors are formed in much the same way as the MOM capacitors with the exception that at least one of the electrodes, if not both, comprises polysilicon that is doped to achieve the desired degree of conductance.

A drawback of MOM and POP capacitors is the number of processing steps used to form such capacitors. Both of these structures require additional mask-steps during the IC manufacturing process, which directly translates into added cost. With each processing step, the manufacturing cost of the integrated circuit increases, and due to the competitive market that exists in the IC fabrication industry, any additional cost is highly undesirable. Thus, the IC industry constantly looks for ways to streamline its processes to provide the market with a lower cost, high quality, integrated circuits.

Accordingly, what is needed in the art is a capacitor structure which continues to provide accurate capacitance values and high capacitance values per unit area, but that is capable of being manufactured using the least number of processing steps possible and thereby, saving manufacturing costs.

SUMMARY OF THE INVENTION

To address the above-discussed deficiencies of the prior art, the present invention provides a capacitor structure comprising an array having two dimensions and having first and second electrode elements alternating in both dimensions of the array. The first electrode elements are interconnected and the second electrode elements are interconnected in such a way to cause the array to function as a capacitor. The capacitor structure further comprises a dielectric material that separates the first and second electrode elements in both of the dimensions. In a preferred embodiment, the dielectric material may be silicon dioxide ($SiO_2$). However, other well known semiconductor dielectric materials may be used, such as a tantalum pentoxide or silicon nitride. In one embodiment, the first electrode elements are interconnected by a first interconnect, and the second electrode elements are interconnected by a second interconnect.

Thus, in a broad scope, the present invention provides an interdigitated capacitor structure. The interdigitated capacitor structure allows for increased capacitance values by taking advantage of the high sidewall capacitance that arises from the array of first and second electrode elements in the capacitor structure.

In one aspect of the invention, the capacitor structure has a width of about 50 $\mu$m and has a capacitance value of about 20 fF/$\mu$m. However, one having skill in the art knows the width of the capacitor structure could be greater or less than about 50 $\mu$m, and could have a capacitance value of greater or less than about 20 fF/$\mu$m.

In another embodiment of the invention, the first and second electrode elements comprise copper. However, in a different embodiment the first and second electrode elements may comprise a conductive material selected from the group consisting of doped polysilicon, aluminum or combinations thereof. In the embodiment that uses copper, a barrier layer that is located between the first electrode elements and second electrode elements, and the dielectric materials, may be required. The barrier layer may comprise tantalum nitride (TiN) or any other suitable material known to those who are skilled in the art. The presence of the barrier layer may, of course, depend on the material composition of the electrode element being used. Once the material from which the electrode will be formed is chosen, the appropriate barrier layer material may be selected, if the barrier layer is so required.

Another aspect of the present invention provides a method of fabricating the capacitor structure. In this embodiment, the method includes (1) forming an array having two dimensions and having first and second electrode elements alternating in both dimensions of the array, the first electrode elements interconnected and the second electrode elements interconnected, to cause the array to function as a capacitor; and (2) forming dielectric material between the first and second electrode elements in both of the dimensions.

In yet another aspect, the present invention provides an IC. This particular embodiment includes transistors located on a semiconductor wafer substrate, which may in one embodiment, form a CMOS or a Bipolar device. The IC also includes interconnects located within dielectric layers positioned over the transistors. The interconnects connect the transistors together to form an operative IC. The capacitor structure as just described above is also included in this particular embodiment.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
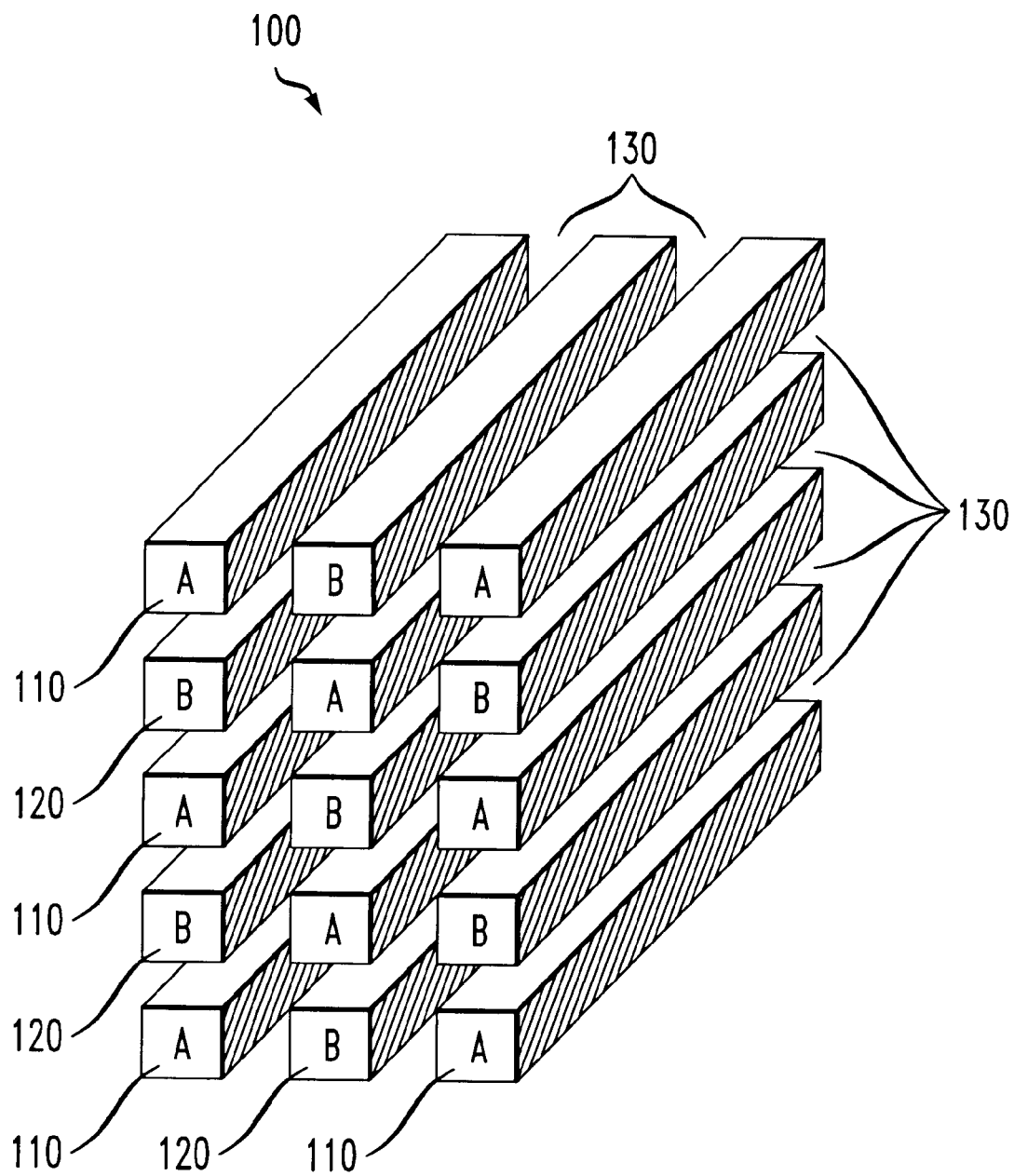
FIG. 1 illustrates a general schematic view of a capacitor structure covered by the present invention.

Referring initially to FIG. 1, illustrated is one embodiment of a simple schematic view of a capacitor structure 100 covered by the present invention. The capacitor structure 100 includes first electrode elements 110 (also designated as "A") and second electrode elements 120 (also designated as "B"). As illustrated, the first electrode elements 110 and the second electrode elements 120 alternate in both dimensions of an array to form an interdigitated capacitor structure. In the illustrated embodiment the first electrode elements 110 and the second electrode element alternate in at least two dimensions. For illustrative purposes, one could vision the capacitor structure 100 as shown in FIG. 1, alternating in the x and y dimensions. Of course, the alternating pattern is not limited to these two particular dimensions. One having skill in the art knows, obviously, the number of electrode elements in each dimension of the array will vary depending on design requirements and the desired degree of capacitance.

The electrode elements 110, 120, of course, comprise a conductive material. In one preferred embodiment the conductive material includes copper. However, in an alternative embodiment the electrode elements 110, 120, may comprise a doped polysilicon, aluminum or titanium nitride (TiN). It should be noted that the composition of the first and second electrode elements 110, 120, may vary from each other; that is, their composition need not be identical. For example, one electrode may be a doped polysilicon and the other electrode may be copper, or one electrode may be TiN, while the other electrode is aluminum. The choice of conductive materials and dielectric materials depends on the application and is well within the skill of the art.

Located between the first electrode elements 110 and second electrode elements 120, in both dimensions, is a dielectric material 130. In one embodiment of the invention, the dielectric material is silicon dioxide ($SiO_2$). However, one having skill in the art knows that other dielectric materials, such as tantalum pentoxide ($Ta_2O_5$) or silicon nitride (SiN), may also be used. As seen from FIG. 1, the dielectric material 120 extends between the electrode elements 110 and 120 both along the horizontal plane and the vertical plane. Thus, capacitance is provided along both of these axis.

Figure 2A:
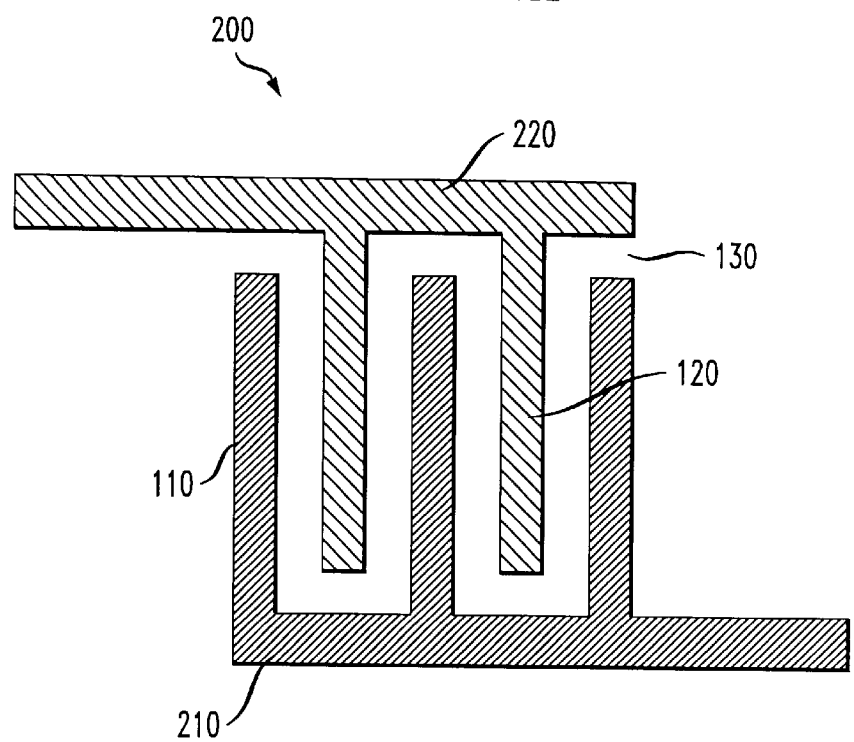
FIG. 2A illustrates a plan view of one layer of the capacitor structure.

Turning now to FIG. 2A, illustrated is a plan view of one layer 200 of the capacitor structure 100 of FIG. 1. The plan view shows the capacitor structure 100 in the x-dimension and a z-dimension. Illustrated in FIG. 2A are the first electrode elements 110 and second electrode elements 120. As illustrated, the first electrode elements 110 are interconnected by a first interconnect 210. Also, as illustrated, the second electrode elements 120 are interconnected by a second interconnect 220. The electrode elements 110, 120, are offset such that they are not in contact with the opposing interconnects 220, 210, respectively. Thus, the electrode elements 110, 120, and the interconnects 210, 220, combine to form an interdigitated capacitor. One having skill in the art knows, obviously, that other layers, each having electrode elements 110, 120 could be positioned above the layer 200, as described in FIG. 2B, which follows.

Figure 2B:
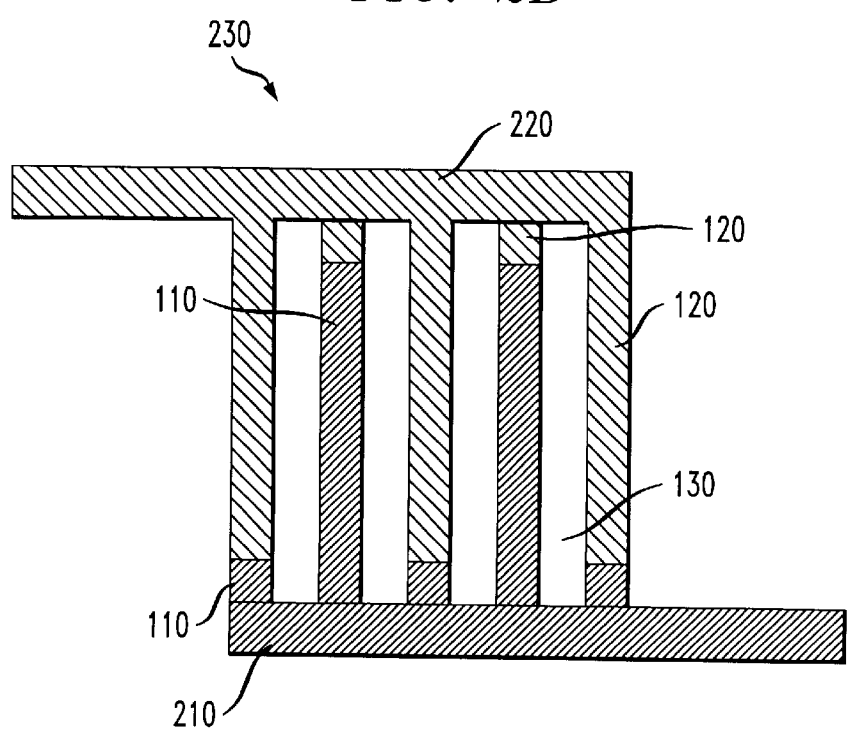
FIG. 2B illustrates a plan view of multiple layers of the capacitor structure.

Turning now to FIG. 2B, illustrated is a plan view of multiple layers 230 of the capacitor structure 100. Illustrated in FIG. 2B are the first electrode elements 110 and the second electrode elements 120 of FIG. 2A, having second electrode elements 120 and first electrode elements 110, respectively positioned thereover. The first and second electrode elements 110 and 120 are cross-hatched differently to illustrate how they are connected to the first and second interconnect structures 210, 220, respectively.

Figure 3:
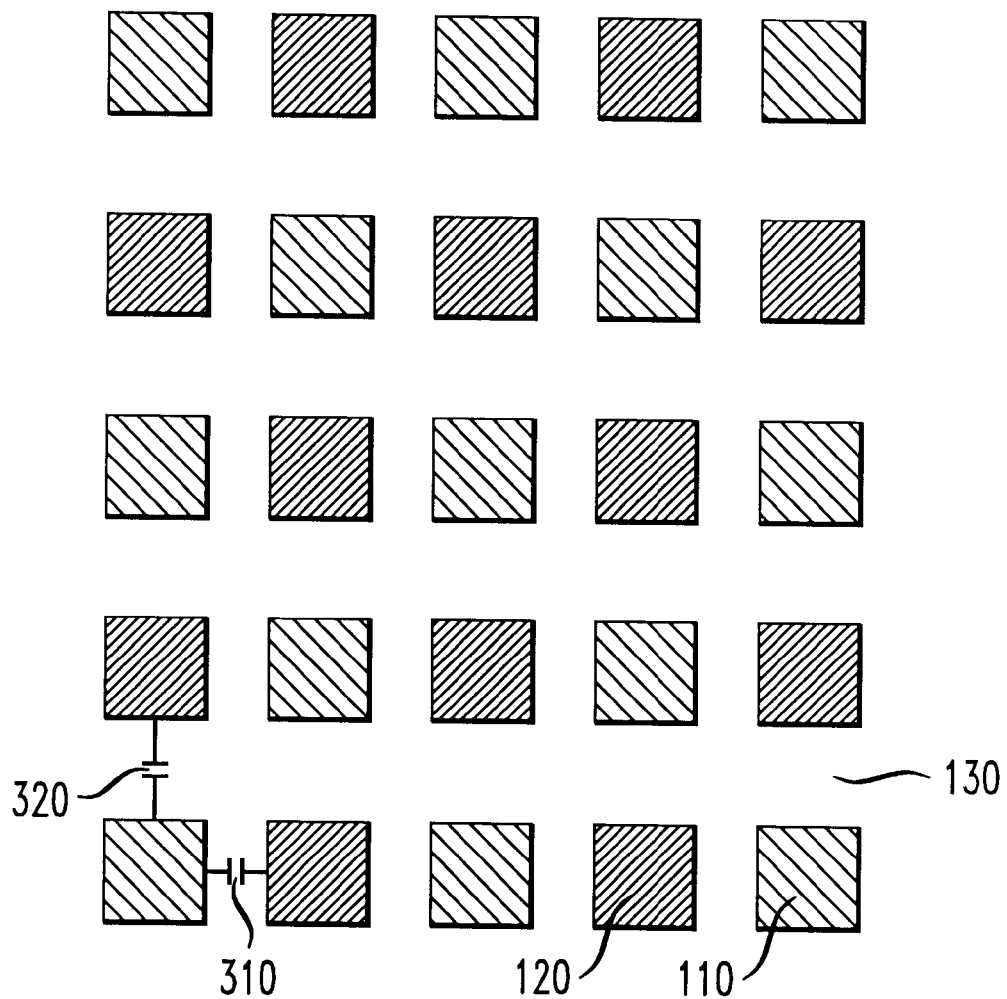
FIG. 3 illustrates a sectional view of the two-dimensional array, as illustrated in FIG. 1, further including an interline component and an area component.

Turning now to FIG. 3, illustrated is a schematic sectional view of the array having two dimensions as illustrated in FIG. 1, further including an interline component 310 and an area component 320. One having skill in the art knows that a standard capacitor only has an area component. However, since the illustrated capacitor structure 100 has both an interline component 310 and an area component 320, and each theoretically contributes to the capacitance density of the interdigitated capacitor, the capacitor structure 100 is capable of providing larger capacitance values per unit area.

Figure 4:
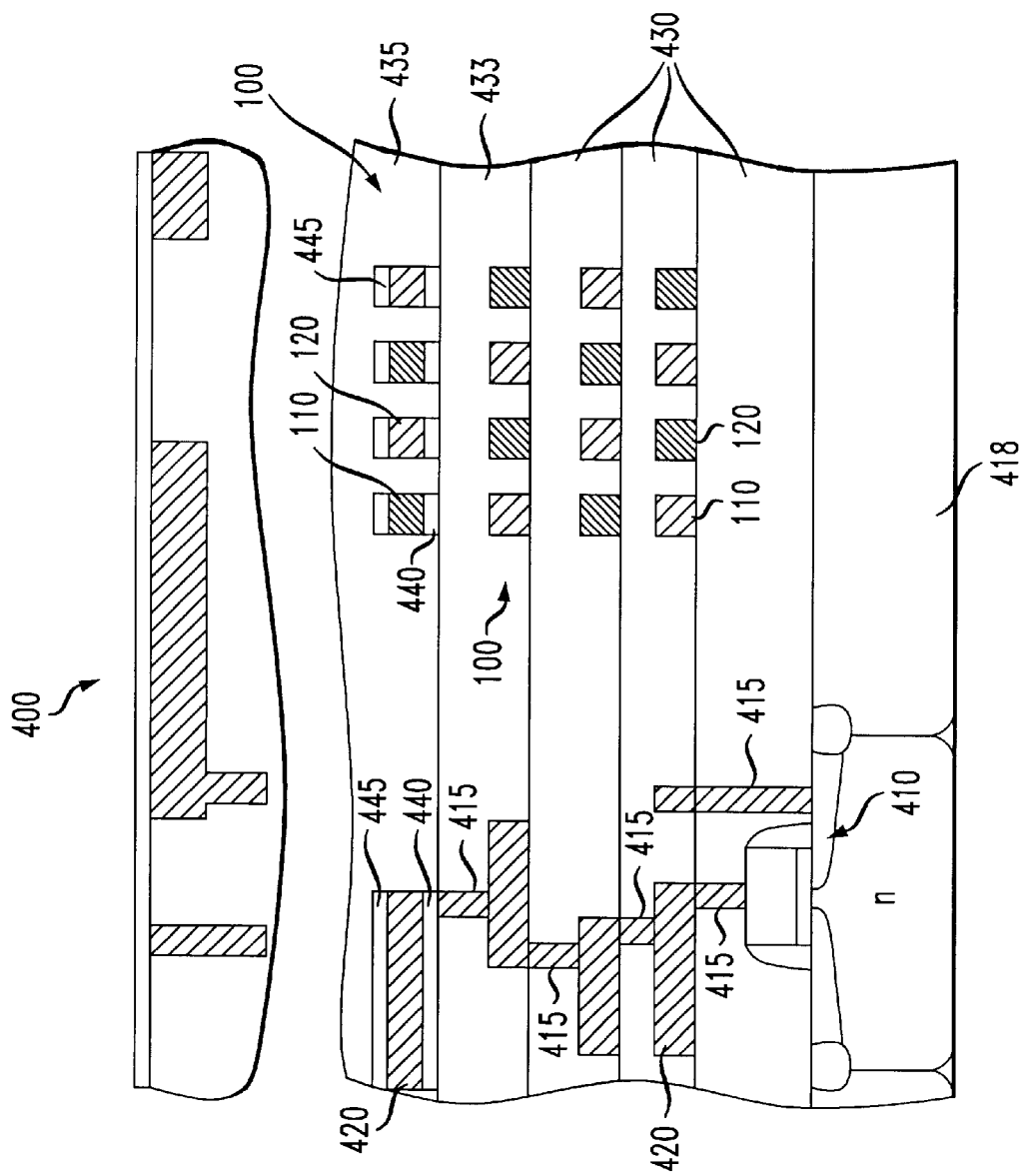
FIG. 4 illustrates the capacitor structure illustrated in FIGS. 1–3, located within an integrated circuit.

Turning now to FIG. 4, illustrated is a partial sectional view of the capacitor structure 100 illustrated in FIGS. 1–3, located within an IC 400. Also illustrated in FIG. 4 is a transistor 410 that is connected to interconnects 420 by contacts or vias 415. Dielectric layers 430 isolate the various layers of the IC. As illustrated, the transistor 410 is located on a semiconductor wafer substrate (generally designated 418), and the interconnects 420, which are located within the dielectric layer 430, connect the transistor 410 to different layers within the IC circuit 400. One having skill in the art knows how to fabricate the transistors 410, interconnects 420, contacts or vias 415 and dielectric layers 430. Furthermore, it is also understood that multiple capacitor structures 100, transistors 410, interconnects 420 and dielectric layers 430, are typically combined to form the IC 400.

The first and second electrode elements 110, 120, on each level may be efficiently formed from the same metal layer from which the interconnects 420 are formed. This not only accomplishes the incorporation of the capacitor structure 100 into the IC 400, but it does so without additional processing steps and therefore, additional cost. However, the first and second electrode elements 110, 120 may be formed in separate processing steps if so desired.

Figure 4A:
FIGS. 4a–4c illustrate the steps of forming a capacitor within an integrated circuit.
Figure 4B:
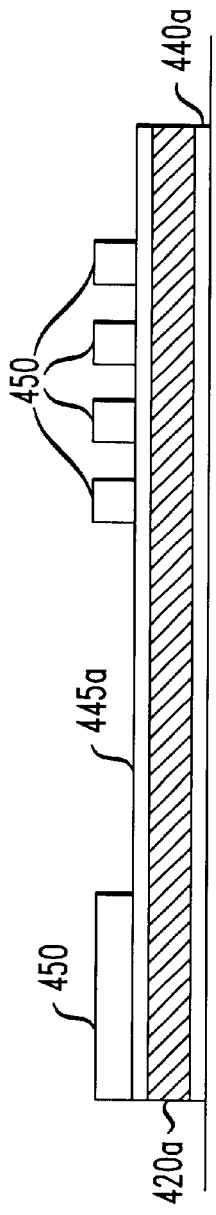
Figure 4C:
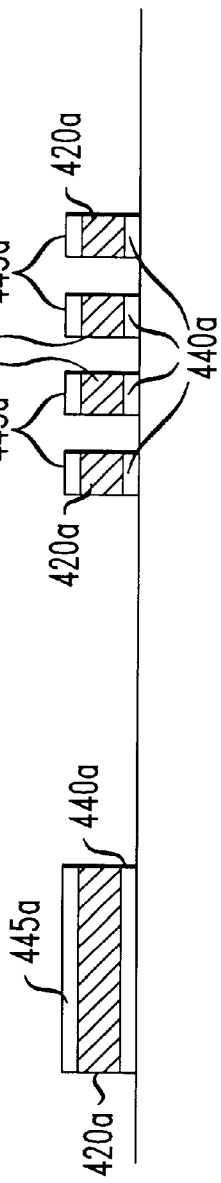

Turning now to FIGS. 4A–4C, with continued reference to FIG. 4, there is shown one embodiment of a processing sequence for fabricating the first and second electrodes 110, 120 on a representative level of the IC 400. A barrier layer 440 is optionally deposited on a dielectric layer 435 at the desired level. The barrier layer 440a is normally desired where diffusion might occur between two different structures. As mentioned earlier, the first and second electrode structures 110, 120, may in one embodiment comprise copper. In such an embodiment, the barrier layer 440a, such as TaN, is preferably used to prevent diffusion. In another embodiment, the first and second electrode structures 110, 120 may comprise aluminum and in such embodiments, the barrier layer 440a may comprise TiN. One who is skilled in the art understands that other barrier layers having different compositions might be required, or none at all, depending on the material composition of the electrode structure chosen.

A metal layer 420a is conventionally deposited by chemical vapor deposition (CVD) processes or physical vapor deposition processes (PVD) on the barrier layer 440a, and a second barrier layer 445a is deposited on the metal layer 420a. The second barrier layer 445a, in preferred embodiments, will be comprised of the same barrier layer material as barrier layer 440a. However, in some embodiments, they may differ. A photoresist 450 is then conventionally deposited over the metal layer 420a. The photoresist 450 is exposed through a mask (not shown) that includes the images of not only the interconnects 420, but also the images of the first and second electrode elements 110, 120. The photoresist is then conventionally developed and removed, leaving those areas where the interconnect 420 and the first and second electrode elements 110, 120, of the capacitor structure 100 are to be located covered by the photoresist. The areas uncovered by the photoresist 450 are then etched, and the remaining photoresist 450 is removed, leaving the interconnect 420 and the first and second electrode elements 110, 120, as illustrated in FIG. 4C. Another dielectric layer is then deposited over these structures to form the base for the next metal level. FIG. 4C illustrates only one level interconnect 420 and one layer of electrode elements 110, 120, in which the barrier layers 440, 445 are present. This is for illustrative purposes only, and those who are skilled in the art understand that the barrier layer could be present in each level if material parameters so require. In other words, the barrier layer 440 may be located on or under as many or as few interconnects 420 and electrode elements 110, 120, as the device design requires.

Turning again to FIG. 4, the capacitor structure 100 uses the dielectric layers 430 within the integrated circuit 400 as the dielectric material that separates the first and second electrode elements 110, 120, in both directions of the array. To incorporate the capacitor structure 100 into the integrated circuit no additional steps would be required over those steps required to form the interconnects. The only difference would be that a different mask, allowing for the addition of the electrode elements 110, 120, would be used to develop the photoresist. Thus, each level of the integrated circuit would be manufactured in such a fashion, forming multiple interconnects 420, and multiple layers of alternating first and second electrode elements 110, 120, during the same manufacturing step.

With respect to FIGS. 1–4, one having skill in the art knows that the different crosshatches used to illustrate the first electrode elements 110 and the second electrode elements 120 does not necessarily illustrate different material compositions. However, the different crosshatch is used as a way to separate the first electrode elements 110, which all are interconnected by a first interconnect 210 (FIG. 2A), from the second electrode elements 120, which all are interconnected by a second interconnect 220 (FIG. 2A).

Figure 5:
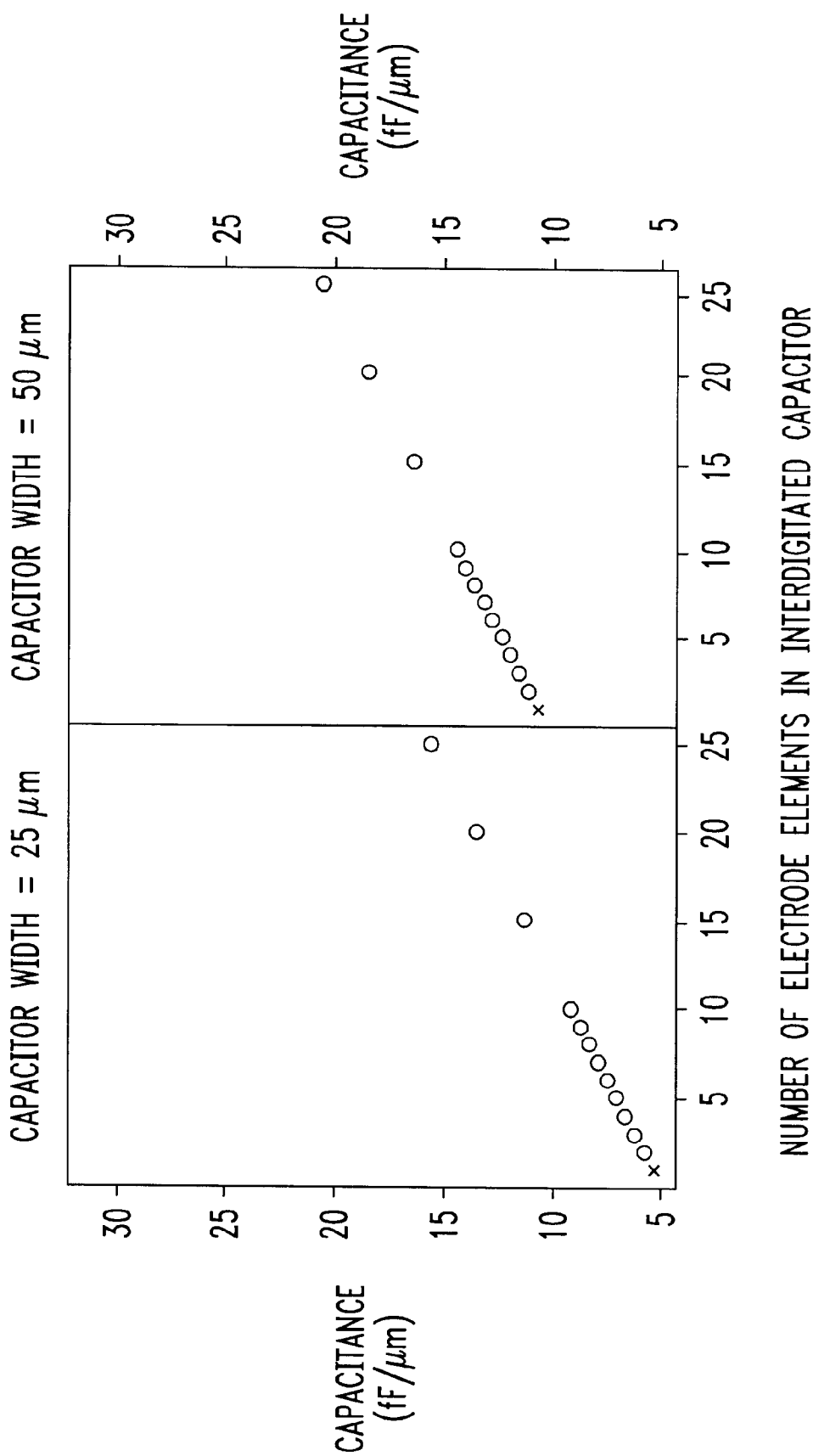
FIG. 5 illustrates a graph that represents the increase in capacitance gained by using the interdigitated capacitor, for a given area, versus using a stacked capacitor having that same area.

Turning to FIG. 5, illustrated is a graph that represents the increase in capacitance gained by using the interdigitated capacitor, represented by an O, for a given area, versus using a stacked capacitor, represented by an X, having that same area. One can gather from FIG. 5, that a capacitor structure having a width of about 50 $\mu$m and consisting of about 25 electrode elements has a capacitance value of about 20 fF/$\mu$m. However, one who is skilled in the art can understand that the width of the capacitor structure and number of electrode elements may be both increased or decreased, giving a capacitance value that may be greater than about or less than about 20 fF/$\mu$m. Furthermore, the graph clearly represents, that for a given area, the interdigitated capacitor structure 100 (FIG. 4) provides a greater capacitance value than the stacked capacitor.

Although the present invention has been described in detail, those skilled in the art should understand that they can make various changes, substitutions and alterations herein without departing from the spirit and scope of the invention in its broadest form.

What is claimed is:

1. A method of fabricating a capacitor structure, comprising:

forming an array having two dimensions wherein a width of the array is about 25 $\mu$m, and having first and second electrode elements alternating in both dimensions of the array, the first electrode elements interconnected and the second electrode elements interconnected, to cause the array to function as a capacitor where a ratio of a capacitance of the array to a capacitance of a stacked capacitor having a same area as the array is about 2; and forming dielectric material between the first and second electrode elements in both of the dimensions.

2. The method as recited in claim 1 wherein forming the array includes interconnecting the first electrode elements by a first interconnect and interconnecting the second electrode elements by a second interconnect.

3. The method as recited in claim 1 wherein forming a dielectric material between the first and second electrode elements includes forming silicon dioxide.

4. The method as recited in claim 1 wherein fabricating the capacitor structure includes fabricating the capacitor structure to a width of about 50 $\mu$m wherein the capacitor structure has a capacitance value of about 20 fF/$\mu$m.

5. The method as recited in claim 1 wherein forming the array includes forming first and second electrode elements with copper.

6. The method as recited in claim 5 further comprising forming a barrier layer located between the first and second electrode elements, and the dielectric material.

7. The method as recited in claim 6 wherein forming a barrier layer includes forming a barrier layer with tantalum nitride.

8. The method as recited in claim 1 wherein forming an array includes forming first and second electrode elements comprised of a conductive material selected from the group consisting of:

doped polysilicon, titanium nitride, and aluminum.

9. The method as recited in claim 1 wherein the array has a gained capacitance of about 0.4 fF/$\mu$m for each of the first or second electrode elements.

* * * * *